US008779787B2

(12) United States Patent
Laplanche (10) Patent No.: US 8,779,787 B2
(45) Date of Patent: Jul. 15, 2014

(54) APPARATUS AND METHOD FOR DETERMINING VARIATION IN A PREDETERMINED PHYSICAL PROPERTY OF A CIRCUIT

(75) Inventor: Yves Thomas Laplanche, Crolles (FR)

(73) Assignee: ARM Limited, Cambridge (GB)

( * ) Notice: Subject to any disclaimer, the term of this patent is extended or adjusted under 35 U.S.C. 154(b) by 420 days.

(21) Appl. No.: 13/297,368

(22) Filed: Nov. 16, 2011

(65) Prior Publication Data
US 2013/0120009 A1 May 16, 2013

(51) Int. Cl.
G01R 31/00 (2006.01)
G01R 25/00 (2006.01)
G01R 29/02 (2006.01)
G01R 23/15 (2006.01)
G01R 19/00 (2006.01)
G01R 29/027 (2006.01)
G01R 25/08 (2006.01)

(52) U.S. Cl.
CPC ............. G01R 29/023 (2013.01); G01R 23/15 (2013.01); G01R 19/0038 (2013.01); G01R 29/027 (2013.01); G01R 25/08 (2013.01)
USPC ..................... 324/750.01; 324/76.48; 702/79

(58) Field of Classification Search
CPC ........ G01R 23/02; G01R 23/10; G01R 23/15; G01R 29/00; G01R 29/02; G01R 29/023; G01R 29/027; G01R 19/00; G01R 19/0084; G01R 19/0092; G01R 19/0038; G01R 19/255; G01R 25/08; G01R 13/02

USPC ........... 324/500, 522, 532, 535, 537, 750.01, 324/676, 710, 139, 436, 442, 76.11, 76.12, 324/76.16, 76.39, 76.48, 76.62; 702/79, 65, 702/64, 57, 1, 108, 117, 125
See application file for complete search history.

(56) References Cited

U.S. PATENT DOCUMENTS

| 3,875,501 | A  | * | 4/1975  | Hayashi ......................... 324/712 |
| 4,356,447 | A  | * | 10/1982 | Honig et al. .................... 324/169 |
| 5,557,409 | A  | * | 9/1996  | Downer et al. ................ 356/600 |
| 7,256,599 | B2 | * | 8/2007  | Matsuno ..................... 324/750.3 |
| 7,746,183 | B2 | * | 6/2010  | Kim et al. ........................ 331/44 |
| 2007/0008100 | A1 | * | 1/2007 | Qi et al. ......................... 340/506 |

(Continued)

OTHER PUBLICATIONS

Stawiasz et al., "On-Chip Circuit for Monitoring Frequency Degradation Due to NBTI", *IEEE*, 2008, pp. 532-535.

(Continued)

Primary Examiner — Hoai-An D Nguyen
(74) Attorney, Agent, or Firm — Nixon & Vanderhye P.C.

(57) ABSTRACT

Apparatus and method for determining variation in a predetermined physical property of a circuit. The apparatus includes monitored circuitry for generating output pulses, and configured such that each output pulse has a pulse width which is indicative of the current value of the predetermined physical property. Circuitry is then configured to receive both the output pulses generated by the monitored circuitry and an oscillating timing reference signal. With reference to the oscillating timing reference signal, the counter circuitry produces for each output pulse an associated count value indicative of the pulse width of that output pulse. Circuitry then compares the associated count values for at least two output pulses, in order to produce a comparison result used to determine the variation in the predetermined physical property. This provides a flexible mechanism for monitoring variations in a physical property on the fly during use of a data processing circuit.

19 Claims, 10 Drawing Sheets (56) References Cited

U.S. PATENT DOCUMENTS

| | | | |
|---|---|---|---|
| 2007/0067678 A1* | 3/2007 | Hosek et al. | 714/25 |
| 2011/0095811 A1* | 4/2011 | Chi et al. | 327/512 |
| 2011/0227632 A1* | 9/2011 | Lotto et al. | 327/509 |

OTHER PUBLICATIONS

Keane et al., "An All-In-One Silicon Odometer for Separately Monitoring HCI, BTI, and TDDB", *IEEE Journal of Solid-State Circuits*, vol. 45, No. 4, Apr. 2010, pp. 817-829.

Keane et al., "An Array-Based Odometer System for Statistically Significant Circuit Aging Characterization", *IEEE Journal of Solid-State Circuits*, vol. 46, No. 10, Oct. 2011, pp. 1-12.

Chouard et al., "A Test Concept for Circuit Level Aging Demonstrated by a Differential Amplifier", *IEEE*, 2010, pp. CR2.1-CR2.4.

Oner et al., "A Compact Monitoring Circuit for Real-Time On-Chip Diagnosis of Hot-Carrier Induced Degradation", *Proc. IEEE*, vol. 10, Mar. 1997, pp. 72-76.

Saneyoshi et al., "A Precise-Tracking NBTI-Degradation Monitor Independent of NBTI Recovery Effect", *IEEE Int'l. Solid-State Circuits Conference*, Session 9, 2010, pp. 192-194.

Chen et al., "A TDC-based Test Platform for Dynamic Circuit Aging Characterization", *IEEE*, 2011, pp. 2B.2.1-2B.2.5.

Faynot et al., "A new structure for in-depth history effect characterization on Partially Depleted SOI transistors", *IEEE International SOI Conference*, Oct. 2002, pp. 35-36.

M. Hashimoto, "Run-Time Adaptive Performance Compensation using On-chip Sensors", *IEEE*, 2011, pp. 285-290.

T. Kim, "Design Techniques for Ultra-low Voltage Sub-threshold Circuits and On-chip Reliability Monitoring", *Dissertation Submitted to the Faculty of the Graduate School—Univ. of Minnesota*, Oct. 2009, 214 pgs.

* cited by examiner

APPARATUS AND METHOD FOR DETERMINING VARIATION IN A PREDETERMINED PHYSICAL PROPERTY OF A CIRCUIT

BACKGROUND OF THE INVENTION

1. Field of the Invention

The present invention relates to an apparatus and method for determining variation in a predetermined physical property of a circuit.

2. Description of the Prior Art

In modern data processing systems, the individual components of data processing circuits are becoming smaller and smaller. As process geometries shrink, the variations in certain physical properties of the individual circuit components is becoming more significant, and techniques are required to enable those variations to be determined.

One physical property that may vary significantly between circuit components is referred to as an ageing effect, a variation in the ageing effect amongst components resulting from a variation in performance degradation of individual transistors over time. Examples of articles that describe monitoring techniques for the ageing effect are "An Array-Based Odometer System for Statistically Significant Circuit Aging Characterization" by John Keane et al, IEEE Journal of Solid-State Circuits, Volume 46, No. 10, October 2011, and the article "A Precise-Tracking NBTI-Degradation Monitor Independent of NBTI Recovery Effect" by E Saneyoshi et al, 2010 IEEE International Solid-State Circuits Conference, Session 9, Digital Circuits and Sensors. However, both of these techniques are invasive, requiring an external tester to be used.

Another type of physical property that may vary between components within a circuit is a history effect that can occur in transistors that have a body region insulated from the substrate, the body region comprising the channel material in which a channel is established between a source and drain of the transistor below the gate of the transistor. One known technology that can be used to produce transistors having a body region insulated from the substrate is referred to as Silicon-On-Insulator (SOI) technology, where the SOI channel material is formed within a region of a thin superficial silicon layer above an oxide insulating layer and located under the gate of the transistor, reducing resistive leakage to the substrate and capacitive loading by the substrate. However, it has been found that the voltage on the body region becomes dependent on the previous circuit activity, this typically being referred to as the history effect. This variation in voltage on the body region can have an impact on the behaviour of components constructed using such transistors. The article "A New Structure for In-Depth History Effect Characterization on Partially Depleted SOI Transistors" by O Faynot et al, 2002 IEEE International SOI Conference, 10/02, pages 35 to 36, describes a technique for measuring the history effect, but similarly to the earlier described articles is invasive, and requires use of an external test probe.

Whilst techniques that use external testing equipment can be useful during the design and manufacture of components, for example to allow suitable margins to be set, it is still desirable to provide mechanisms that allow variations in certain physical properties to be monitored "on the fly" whilst circuits are in use, since if accurate information about such variations can be obtained in real time during use of the circuit, it may be possible to take certain actions in order to reduce or at least constrain such variations. The article "Run-Time Adaptive Performance Compensation using On-Chip Sensors" by M Hashimoto, Department of Information Systems Engineering, Osaka University and JST, CREST, ASP-DAC '11 Proceedings of the 16th Asia and South Pacific Design Automation Conference, pages 285-290, describes a run-time performance adaptation technique using on-chip sensors for capturing delay variations, with circuit performance then being compensated according to the sensor outputs. The described technique does not provide any quantitive information as to the variations being observed.

A number of articles have been published that discuss techniques for monitoring the ageing effect of transistors on the fly during operation of integrated circuits. Examples of such articles include the article "A Compact Monitoring Circuit for Real-Time On-Chip Diagnosis of Hot-Carrier Induced Degradation" by H Oner et al, Proceedings of the IEEE 1997 International Conference on Microelectronic Test Structures, Volume 10, March 1997, the article "A TDC-Based Test Platform for Dynamic Circuit Ageing Characterisation" by M Chen et al, 2011 IEEE International Reliability Physics Symposium (IRPS), 10-14 Apr. 2011, 2B.2.1-2B.2.5, the article "On-Chip Circuit For Monitoring Frequency Degradation due to NBTI" by K Stawiasz et al, IEEE CFP08RPS-CDR 46th Annual International Reliability Physics Symposium, Phoenix, 2008, Pages 532 to 535, and the article "An All-In-One Silicon Odometer for Separately Monitoring HCI, BTI and TDBD" by J Keane et al, IEEE Journal of Solid-State Circuits, Volume 45, No. 4, April 2010, Pages 817 to 829. Each of these techniques uses a ring oscillator as the circuitry to be monitored, and as such lacks flexibility in that the circuitry being monitored is somewhat artificial and cannot directly represent an actual circuit portion of a real data processing apparatus, for example a critical path within a processor. In addition, such techniques using ring oscillators as the monitored circuit cannot measure certain physical properties such as the earlier-mentioned history effect, since the history effect occurs primarily due to static data and hence the continual dynamic changes that occur within an oscillator will mask the history effect.

In the article "A Test Concept For Circuit Level Aging Demonstrated By A Differential Amplifier" by F. Chouard et al, 2010 IEEE International Reliability Physics Symposium, (IRPS), 2-6 May 2010, pages 826-829, the authors propose applying an accelerated aging technique to an analogue circuit, thereby allowing measurements to be taken from a tester after forced aging of the circuit to model the aging effects. This approach hence seeks to take aging into account by modeling/simulating aging rather than by measuring actual aging in a live circuit.

Accordingly, it would be desirable to provide a more flexible approach for determining variation in a predetermined physical property of a circuit, that can be used on the fly as and when required during the lifetime of the circuit.

SUMMARY OF THE INVENTION

Viewed from a first aspect, the present invention provides apparatus for determining variation in a predetermined physical property of a circuit, comprising: monitored circuitry for generating output pulses, the monitored circuitry being configured such that each output pulse has a pulse width which is indicative of a current value of said predetermined physical property; oscillator circuitry configured to generate an oscillating timing reference signal; counter circuitry configured to produce for each output pulse, with reference to the oscillating timing reference signal, an associated count value indicative of the pulse width of that output pulse; and comparison circuitry configured to compare the associated count values for at least two output pulses, in order to produce a comparison result used to determine the variation in said predetermined physical property.

In accordance with the present invention, the physical property of interest is not measured directly, but instead the monitored circuitry is arranged to produce output pulses such that the pulse width is indicative of a current value of the predetermined physical property. There are a number of ways in which the monitored circuitry can be arranged to produce an output pulse whose pulse width varies in such a manner. For example, the pulse can be generated having a width which is dictated by a signal propagation path delay within the monitored circuit, where that propagation delay will vary dependent on the physical property of interest. As another example, the circuit may be arranged to generate an output pulse whose width is dictated by a time taken to perform a charging operation of a capacitive element, where again the time taken will vary dependent on the current value of the physical property of interest.

In accordance with the invention, counter circuitry is provided which receives each output pulse, and also receives an oscillating timing reference signal produced by oscillator circuitry. Based on these inputs, the counter circuitry can then produce an associated count value for each output pulse, that count value being indicative of the pulse width. In particular, the count value identifies the number of oscillations of the timing reference signal during the duration of the output pulse. The count values hence form digital information providing a quantitive indication of a current value of the physical property, with comparison circuitry then being used to compare two or more such count values in order to produce a comparison result that can be used to determine the variation in the predetermined physical property.

The technique of the present invention is very flexible, since the monitored circuitry can take a variety of forms. In particular, in some embodiments it may be a dummy circuit not performing any active data processing, whilst in another embodiment it may be formed by an active circuit within the apparatus, for example a critical path within a processor or other data processing circuit. Further, many different physical properties can be observed using the technique of the present invention. All that is required is to ensure that the monitored circuitry produces an output pulse whose pulse width will vary to reflect any variations in the predetermined physical property of interest.

In one embodiment, the monitored circuitry comprises a plurality of monitored circuits, and said at least two output pulses compared by the comparison circuitry comprise an output pulse generated by each monitored circuit, with the pulse width of each output pulse being indicative of a current value of said predetermined physical property within the monitored circuit producing that output pulse. Hence, in such embodiments, it is possible to compare multiple count values determined from output pulses produced by multiple monitored circuits at a particular point in time, thereby enabling a determination as to the degree of variation in a physical property amongst the various monitored circuits.

In one embodiment, the counter circuitry comprises a separate counter circuit for each monitored circuit.

The comparison result produced by the comparison circuitry can be used in a variety of ways. In one embodiment, the apparatus further comprises evaluation circuitry configured to generate a notification signal if the comparison result indicates that the variation of the current value of said predetermined physical property within the plurality of monitored circuits is greater than a predetermined threshold. The notification signal can then be used in a variety of ways, for example to provide a warning notification to a user, or to cause certain changes in the operation of the apparatus with the aim of reducing the variation.

In an alternative embodiment, or in addition, a test operation may be initiated periodically, each occurrence of the test operation causing the plurality of monitored circuits to produce corresponding output pulses from which count values are then produced by the counter circuitry. For each test operation, the comparison circuitry is arranged to compare the count values produced by the counter circuitry in order to produce said comparison result, and the apparatus further comprises evaluation circuitry configured to monitor variation in the comparison result over a series of said test operations in order to determine the variation in said predetermined physical property. Hence, in such embodiments, a history of the comparison results produced for a series of test operations can be maintained, and that history then reviewed by the evaluation circuitry in order to determine the variation in the predetermined physical property over time.

The plurality of monitored circuits can take a variety of forms. In one embodiment, the plurality of monitored circuits comprise a tested monitored circuit and a reference monitored circuit. The reference monitored circuit is configured so as to exhibit a benchmark value for said predetermined physical property, and the comparison circuitry is configured to compare the count value for an output pulse from the tested monitored circuit with the count value for a corresponding output pulse from the reference monitored circuit in order to produce said comparison result.

There are a variety of physical properties that can be monitored using such an arrangement. However, in one embodiment, the predetermined physical property is an ageing effect on components within the tested monitored circuit that causes performance of those components to vary through use.

In one such embodiment, the reference monitored circuit is formed as a replica of said tested monitored circuit. Further, the reference monitored circuit is active only for test operations where an output pulse is generated by the reference monitored circuit for comparison with a corresponding output pulse from the tested monitored circuit, whilst the tested monitored circuit is active for other operations in addition to the test operations, such that components in the tested monitored circuit are subjected to the ageing effect more rapidly than the components in the reference monitored circuit. In one particular embodiment, the reference monitored circuit is powered off other than when a test operation is being performed, and hence the components within the reference monitored circuit age very slowly compared with the equivalent components within the tested monitored circuit. Accordingly, the comparison result output by the comparison circuitry provides an accurate indication of the degree of ageing of the components within the tested monitored circuit.

The tested monitored circuit can take a variety of forms, but in one embodiment is used to perform actual data processing operations in a normal mode of operation of the apparatus. Hence, in one embodiment, the tested monitored circuit may form a critical path of a processing circuit of the apparatus. The performance of the components within such a critical path is very important, and the ageing effect will typically increase propagation delays over time. Accordingly, the technique of the above described embodiments provides a very useful mechanism for continuing to monitor periodically the ageing effect within the tested monitored circuit, so that a notification can be issued if the ageing effect exceeds some predetermined level, and prior to any actual timing failure within the critical path.

In an alternative embodiment, the plurality of monitored circuits are distributed at different locations within an integrated circuit, and the comparison circuitry is configured to compare the associated count values for corresponding output pulses produced by each monitored circuit in order to produce the comparison result, the comparison result being indicative of the variation in the predetermined physical property across the integrated circuit. Such an approach provides a simple and effective mechanism for monitoring across-chip variations of a physical property of interest.

The physical property of interest in such embodiments can take a variety of forms. For example, it may be one of a threshold voltage of components, an operating temperature of components, or a history effect of components.

The plurality of monitored circuits distributed within the integrated circuit can take a variety of forms, but in one embodiment are arranged to be identical to each other so as to allow ready comparison of the count values determined for the output pulses produced by the various monitored circuits. In one embodiment, the identical monitored circuits may be active circuits within the integrated circuit, for example a particular critical path within each core of a multi-core implementation. Alternatively, each of the monitored circuits may be dummy circuits constructed identically, such that any variation in their pulse width outputs reflects the variation in the physical property of interest between those various dummy circuits.

Whilst the monitored circuitry may comprise multiple monitored circuits as discussed above, in an alternative embodiment the monitored circuitry may comprise a single monitored circuit configured to produce the at least two output pulses at different times, such that the pulse width of each output pulse is indicative of the value of said predetermined physical property within that single monitored circuit at the time the output pulse is generated.

Such an arrangement may be useful in a variety of scenarios, but in one embodiment the single monitored circuit comprises components formed from transistors having a body region insulated from a substrate, and the predetermined physical property is a history effect that causes voltage on said body region to vary over time dependent on previous activity of the monitored circuit, thereby causing performance of the components to vary over time based on said previous activity.

In one particular embodiment, the single monitored circuit comprises an inverter chain arranged to produce a rising edge output pulse and a falling edge output pulse, the rising edge output pulse having a pulse width indicative of rising edge propagation delays within the inverter chain and the falling edge output pulse having a pulse width indicative of falling edge propagation delays within the inverter chain. The counter circuitry is configured to generate a rising edge count value for said rising edge output pulse, and a falling edge count value for said falling edge output pulse. The comparison circuitry is arranged to compare the rising edge count values for rising edge output pulses produced at different times, and the falling edge count values for falling edge output pulses produced at different times in order to produce the comparison result. By obtaining information about the rising edge propagation delay and falling edge propagation delay it is possible to accurately evaluate variations in the history effect.

The inverter chain can take a variety of forms, but in one embodiment comprises an even number of inverters, with each inverter formed from SOI transistors, and with every alternate inverter having its SOI transistors arranged in a body contacted arrangement.

In one embodiment, the single monitored circuit is driven at a first time by an input signal providing a temporary transition from a DC logic 0 value in order to produce a first rising edge output pulse and a first falling edge output pulse, and is driven at a second time by an input signal providing a temporary transition from a DC logic 1 value in order to produce a second rising edge output pulse and a second falling edge output pulse, the comparison circuitry being arranged to compare the rising edge count values for the first and second rising edge output pulses, and to compare the falling edge count values for the first and second falling edge output pulses in order to produce said comparison result. The history effect results from the presence of static values on the SOI transistors, and hence by simulating both a temporary transition from a DC logic 0 state and temporary transition from a DC logic 1 state, it is possible to build up an accurate picture of the history effect within the monitored circuit.

Viewed from a second aspect, the present invention provides a method of determining variation in a predetermined physical property of a circuit, comprising: employing monitored circuitry to generate output pulses such that each output pulse has a pulse width which is indicative of a current value of said predetermined physical property; generating an oscillating timing reference signal; with reference to the oscillating timing reference signal, producing for each output pulse an associated count value indicative of the pulse width of that output pulse; and comparing the associated count values for at least two output pulses, in order to produce a comparison result used to determine the variation in said predetermined physical property.

Viewed from a third aspect, the present invention provides apparatus for determining variation in a predetermined physical property of a circuit, comprising: monitored circuitry means for generating output pulses such that each output pulse has a pulse width which is indicative of a current value of said predetermined physical property; oscillator means for generating an oscillating timing reference signal; counter means for producing for each output pulse, with reference to the oscillating timing reference signal, an associated count value indicative of the pulse width of that output pulse; and comparison means for comparing the associated count values for at least two output pulses, in order to produce a comparison result used to determine the variation in said predetermined physical property.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
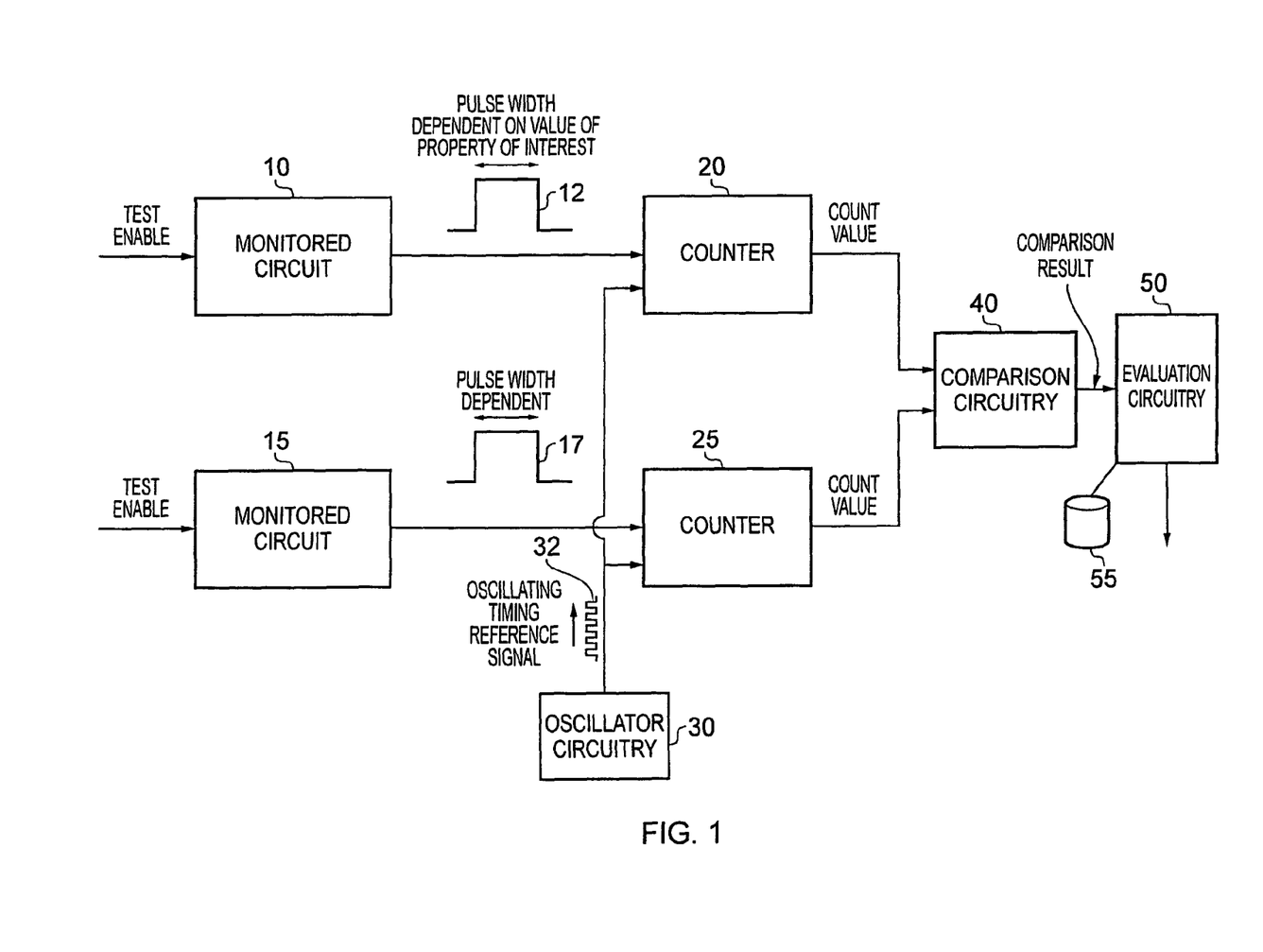
FIG. 1 is a block diagram schematically illustrating an apparatus in accordance with one embodiment.

FIG. 1 is a block diagram schematically illustrating an apparatus in accordance with one embodiment. A monitored circuit 10 is arranged to be responsive to a test enable signal being set to output a pulse 12 whose width is indicative of a current value of a physical property of interest (also referred to herein as a predetermined physical property) observed by the components within the monitored circuit. A counter 20 is arranged to received the output pulse and also to receive an oscillator timing reference signal 32 produced by oscillator circuitry 30. The oscillator circuitry can take any of a variety of known forms, for example a ring oscillator, and is arranged to produce a relatively high frequency oscillating signal so as to enable the counter to determine the number of oscillations of that timing reference signal within the width of the pulse 12.

The count value produced by the counter is then forwarded to comparison circuitry 40 for comparison with at least one other count value produced in respect of another output pulse.

In the example of FIG. 1, the other output pulse 17 is produced by the monitored circuit 15, again in response to a test enable input to the monitored circuit being set. The pulse 17 is provided to the counter 25, which also receives the same oscillating timing reference signal 32 as provided to the counter 20, and accordingly produces a corresponding count value for the pulse 17.

Whilst in FIG. 1 the monitored circuits 10 and 15 are shown as separate circuits, each with their own counter circuit 20, 25, the monitored circuit 15 can in alternative embodiments actually be one and the same circuit as the monitored circuit 10, with the pulses 12, 17 representing pulses produced at different times by the single monitored circuit. In such an embodiment, it will be appreciated that the counter circuitry 20, 25 can also be formed by a single counter circuit with the count values output by the counter being buffered for subsequent comparison by the comparison circuitry 40.

In embodiments where multiple monitored circuits are actually provided, it will be appreciated that any number of monitored circuits may be provided as desired, and accordingly more than two count values may be produced for comparison by the comparison circuitry 40.

The comparison result produced by comparison circuitry 40 is passed to evaluation circuitry 50, and the evaluation circuitry can take a variety of forms. In one embodiment, the evaluation circuitry 50 may analyse each comparison result produced by the comparison circuitry independently, and generate a notification signal if the comparison result indicates that the variation in the predetermined physical property as evidenced by the various count values compared by the comparison circuitry is greater than a predetermined threshold. This notification signal can be used in a variety of ways, for example to provide a warning notification to a user, or to cause certain changes in the operation of the apparatus with the aim of reducing the variation. As one particular example, if the predetermined physical property being monitored is temperature, and the variation in temperature as observed by the comparison circuitry with reference to the count values exceeds a predetermined threshold, the operating speed of the apparatus may be reduced in order to seek to reduce the temperature variation, and/or cooling elements associated with one or more of the monitored circuits may be activated.

In an alternative embodiment, the evaluation circuitry 50 may have an associated storage 55 in which it maintains a history of the comparison results produced by the comparison circuitry 40 for a series of tests, thus enabling the manner in which the comparison results are varying over time to be evaluated, with this information then being used to identify the variation in the predetermined physical property of interest.

Figure 2A:
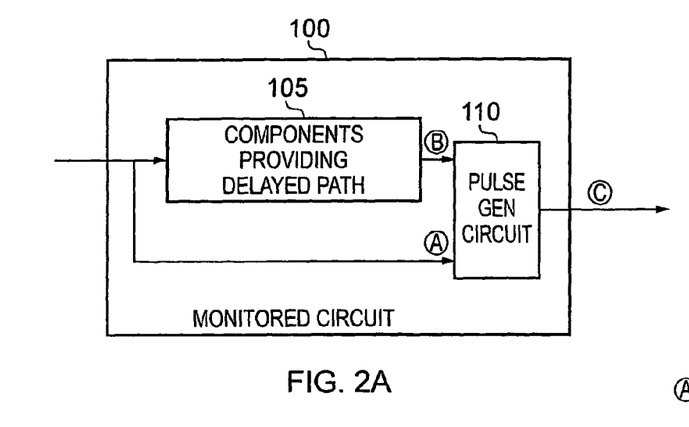
FIGS. 2A and 2B schematically illustrate a monitored circuit in accordance with one embodiment.
Figure 2B:
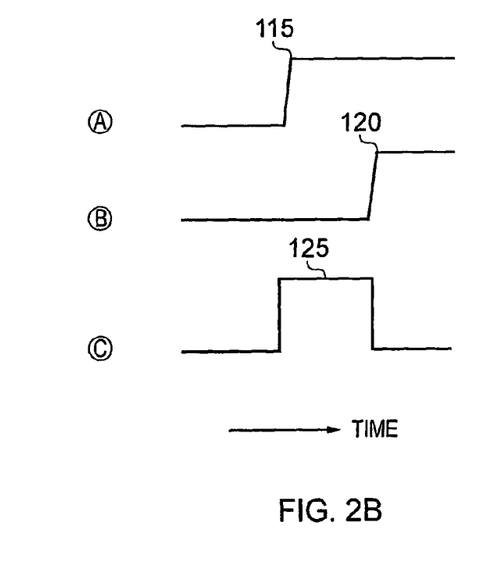

There are a number of ways in which the monitored circuits 10, 15 can be arranged such that they produce an output pulse whose pulse width varies to reflect changes in the predetermined physical property arising within the components of the monitored circuit. In one embodiment, as illustrated in FIGS. 2A and 2B, a signal propagation delay can be arranged to vary dependent on the predetermined physical property, and accordingly a propagation delay across a particular path can be monitored, with a pulse being generated whose width represents that propagation delay. In particular, as shown in FIG. 2A, a propagation delay path 105 can be formed from a plurality of components, and an input test signal may be routed via that delay path 105 to one input of the pulse generation circuitry 110. The second input of the pulse generation circuitry may receive the input test signal directly (i.e. not delayed by the propagation path 105).

FIG. 2B illustrates how a pulse may be generated whose width is dependent on the propagation delay through the path 105. In particular, an input signal A is provided which transitions to a logic one level at time 115. Following the provision of that signal as an input to the delay path 105, the output signal from the delay path is shown by the signal B, it transitioning to a logic one level at time 120. The pulse generation circuit 110 can then be arranged based on the input signals A and B to generate the output signal C incorporating the pulse 125, whose width is dependent on the delay between the times 115 and 120. There are a number of ways in which the pulse generation circuit can be arranged to produce such a pulse, but in one embodiment the pulse generation circuit 110 takes the form of an XOR logic gate.

Figure 3A:
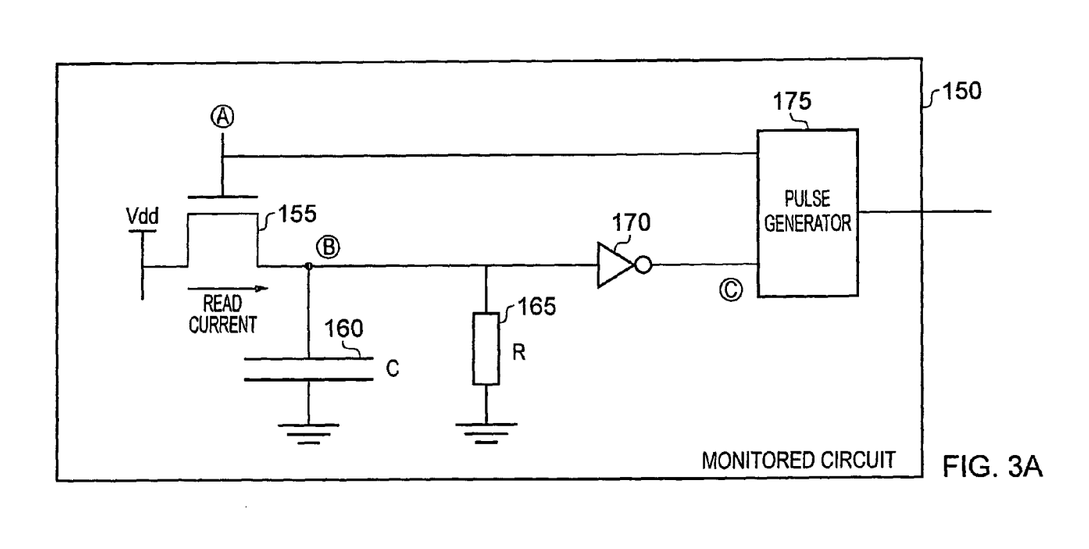
FIGS. 3A and 3B schematically illustrate a monitored circuit in accordance with an alternative embodiment.
Figure 3B:
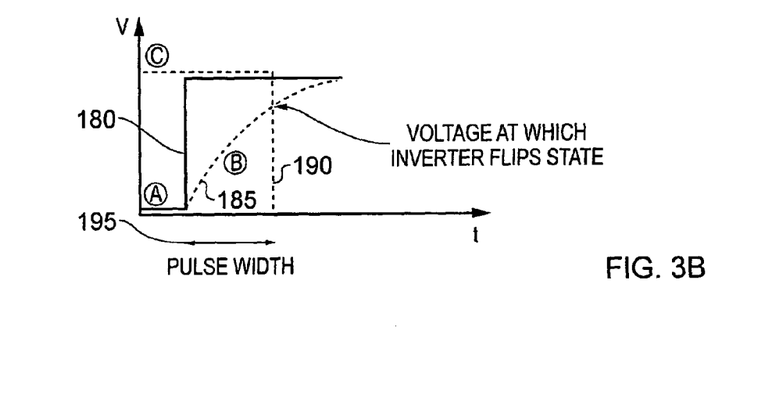

However, propagation delay is not the only mechanism that can be used for producing a pulse whose width varies dependent on variations in the predetermined physical property. In particular, FIGS. 3A and 3B illustrate another example where the read current through a transistor 155 varies dependent on the predetermined physical property, and this variation can be transformed into a pulse by monitoring time taken for the read current to charge a particular capacitive element 160. In the example illustrated in FIG. 3A, the transistor 155 is connected between the power supply Vdd and a node B, with its gate connected to an input test signal. A capacitor 160 and a resistor 165 are then placed in parallel between node B and a ground connection. An inverter 170 connected to node B is then used to provide one input signal C to the pulse generator 175. The other input to the pulse generator 175 is provided by the input test signal A.

FIG. 3B schematically illustrates how a pulse is generated within such a circuit. The input test signal A transitions to a logic one level at time 180, thereby turning on the transistor 155. Until that time, the transistor 155 had been turned off, and accordingly node B was at a logic 0 level, causing a logic 1 value to be provided as input C to the pulse generator 175. However, once the transistor has been turned on, the voltage at node B begins to rise as shown by the line 185 in FIG. 3B.

At some point, the voltage at node B reaches a level causing the output from the inverter 170 to flip state from the logic 1 level to the logic 0 level, as indicated by the line 190 in FIG. 3B. The pulse generator 175 can be used to generate a pulse whose width 195 is dependent on the time between the rising edge 180 of the input test signal A and the falling edge 190 of the signal C. The pulse generator 175 can be formed in a variety of ways, but in one embodiment takes the form of an AND logic gate.

Figure 4:
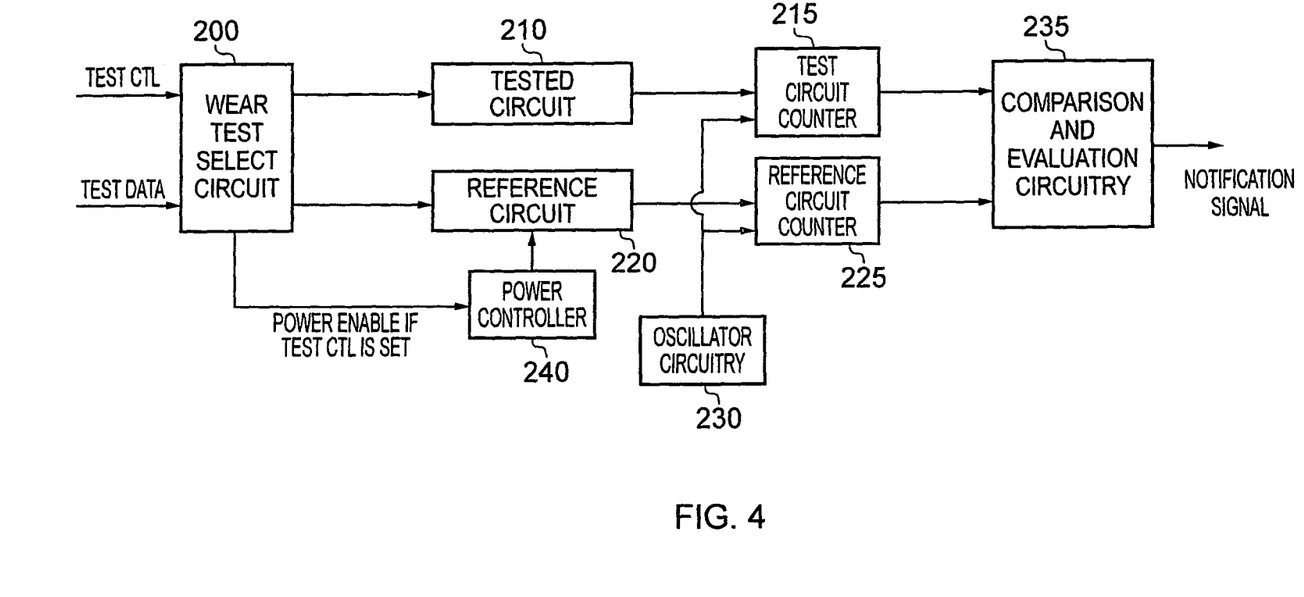
FIG. 4 is a block diagram illustrating an embodiment incorporating both a tested circuit and a reference circuit.

FIG. 4 illustrates a particular embodiment of the circuitry of FIG. 1, where two monitored circuits are provided, namely a tested circuit 210 and a reference circuit 220. The tested circuit 210 is coupled to an associated test circuit counter 215 whilst the reference circuit 220 is connected to an associated reference circuit counter 225, both counters 215, 225 also receiving an oscillating timing reference signal from the oscillator circuitry 230.

In this embodiment, the predetermined physical property of interest is an ageing effect, and in particular an indication as to how the components of the tested circuit are wearing out is required. In this embodiment, the tested circuit can take a variety of forms, but in one embodiment represents active circuitry of a data processing apparatus where the wear out of the components is of a significant concern, one such example being circuitry within a critical path of a processor core.

A wear test select circuit 200 is provided for initiating a test operation when an input test control signal is set. When the test control signal is set, the wear test select circuit 200 sends a power enable signal to the power controller 240 in order to turn on the reference circuit 220. In particular, in such a test it is desired that the reference circuit exhibits a benchmark value for the predetermined physical property, and hence when considering the ageing effect it is important that the reference circuit ages to the smallest extent possible. Accordingly, in one particular embodiment, the reference circuit 220 is arranged to be a replica of the tested circuit 210, but unlike the tested circuit, the reference circuit is only powered up as and when required to perform the test operation. At all other times, the reference circuit is powered down so as to keep the reference path in as ideal a state as possible, i.e. to reflect as closely as possible a version of the tested circuit that is not subjected to ageing.

When the test control signal is set, test data is also input to the wear test select circuit 200, from where it is input in parallel to both the tested circuit 210 and the reference circuit 220. The corresponding counters 215, 225 hence produce count values indicative of the width of the pulses produced by the tested circuit 210 and the reference circuit 220, and those two count values are then compared by the comparison and evaluation circuitry 235.

In the embodiment illustrated in FIG. 4, a notification signal is output from the comparison and evaluation circuitry if it is determined that the wear on the tested circuit has exceeded a predetermined level. One way in which the comparison and evaluation circuitry 235 can be configured in order to produce such a notification signal is illustrated in FIG. 5.

Figure 5:
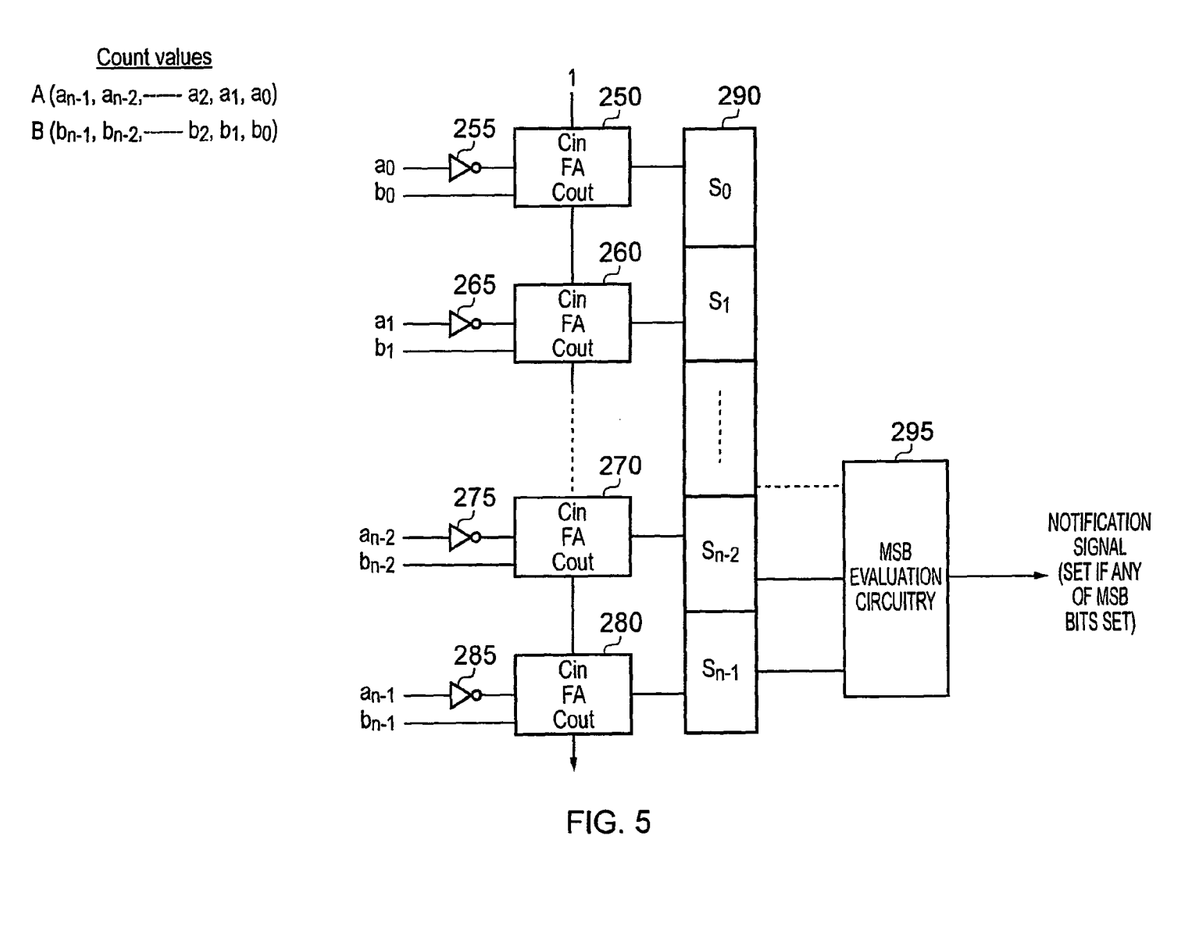
FIG. 5 is a diagram illustrating the construction of the comparison and evaluation circuitry of FIG. 4 in accordance with one embodiment.

As shown in FIG. 5, it is assumed that the count value A is an n-bit value output from the reference circuit counter 225 whilst the count value B is also an n-bit value output by the test circuit counter value 215. The comparison circuitry is formed by the sequence of full adders, 250, 260, 270, 280, which are arranged to determine a difference between the two count values. In particular, the computation B−A is performed, by performing within the full adders the addition of an inverted version of the count value A with the count value B plus an injected logic 1 value in the least significant bit position. Hence, as shown, each full adder 250, 260, 270, 280 includes a corresponding bit of both count values, with the relevant bit of the count value A being inverted prior to input to the full adder. The full adder 250 computes the least significant bit of the difference, and hence receives the carry in of a logic 1 value. Any carry out from the full adder 250 is provided as a carry in value to the next full adder 260, and indeed this arrangement ripples through the entire set of adders, so that any carry out from one full adder is provided as a carry in to the next full adder (i.e. the full adder dealing with the adjacent more significant bits of the count value). The carry out value from the final adder 280 is ignored. The sum bits produced by the various full adders are stored within a sum register 290, whereafter a certain number of most significant bits are evaluated by the MSB evaluation circuitry 295. The number of most significant bits considered will be dependent on implementation, and in particular how much wear in the tested circuit is to be tolerated. If a logic 1 value is found to be present in any of the most significant bits reviewed by the evaluation circuitry 295, the notification signal is set.

Figure 6:
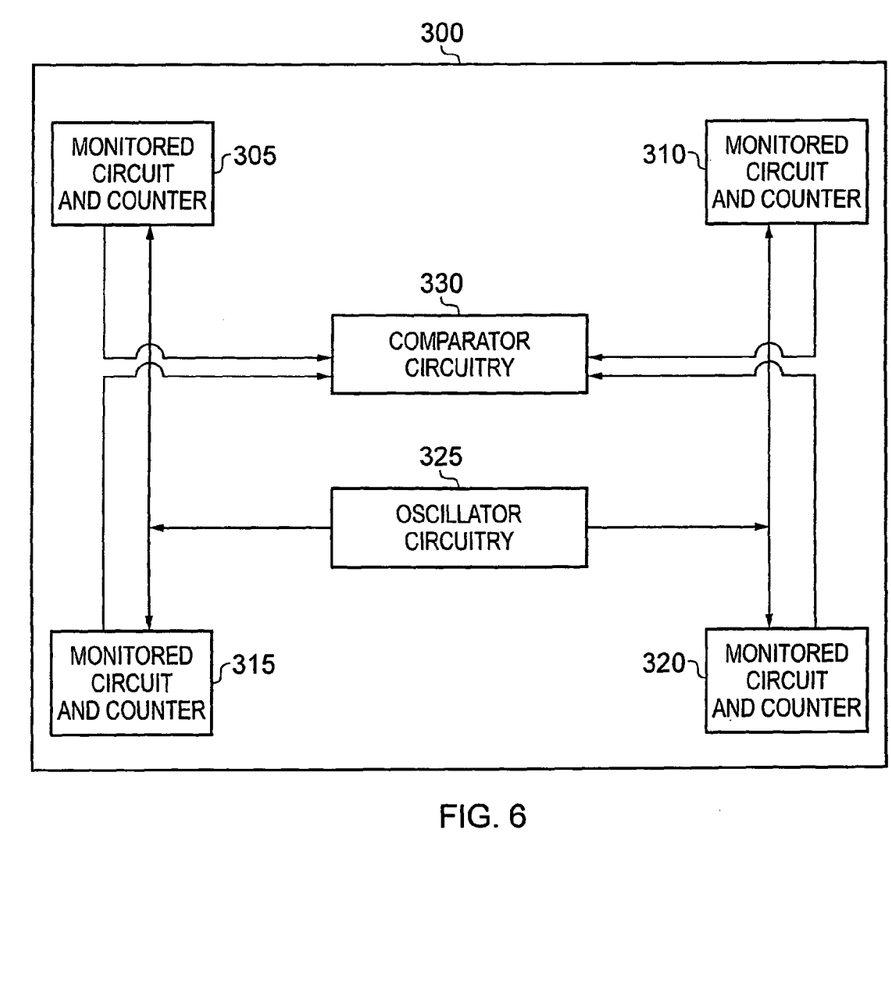
FIG. 6 is a block diagram of an integrated circuit including distributed monitored circuits in accordance with one embodiment.

FIG. 6 illustrates an alternative embodiment, where an across chip variation of a predetermined physical property can be evaluated. In particular, as shown in FIG. 6, an integrated circuit 300 may include a plurality of monitored circuits and associated counters 305, 310, 315, 320, these various circuits being distributed throughout the integrated circuit so as to enable a measure of the predetermined physical property to be obtained from a variety of physical locations within the chip. As with the earlier described embodiments, an oscillator circuit 325 provides an oscillating timing reference signal to each of the counters, and the output count values produced are routed to a comparator circuit 330. The comparator circuit 330 may be arranged to generate a notification signal if the count values from the various monitored circuits vary by more than some predetermined threshold (for example by determining the maximum count value and the minimum count value, and evaluating the difference between those maximum and minimum values). Alternatively, the comparison results obtained for a series of tests performed at different times can be logged and then subsequently evaluated in order to determine how the predetermined physical property is varying over time.

In the embodiment shown in FIG. 6, it will typically be desirable for the various monitored circuits to be identical replicas of each other. In some embodiments, they can be dummy circuits introduced solely for use during test operations, but alternatively they can be active circuits used to perform processing functions within the integrated circuit. In one particular example, the monitored circuits may be critical path portions within each core of a multi-core integrated circuit, thereby allowing variations in a predetermined physical property that are occurring within the different cores to be monitored.

To enable the system of FIG. 6 to provide an accurate across chip variation analysis, the monitored circuits should be composed of a sufficient number of components to average out any local variations.

Figure 7:
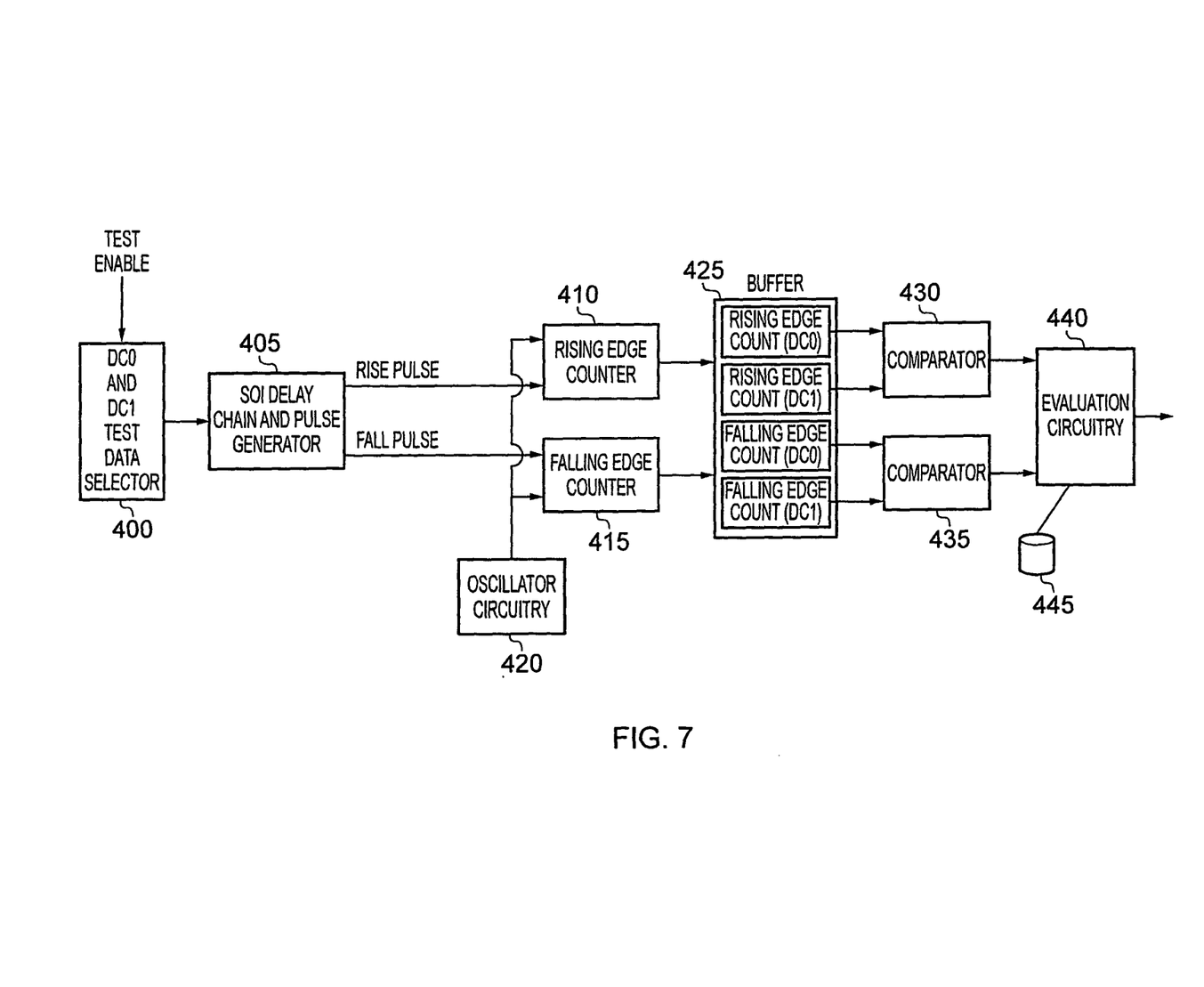
FIG. 7 is a block diagram illustrating an arrangement used in one embodiment to monitor variation in the history effect of SOI transistors.

FIG. 7 illustrates an alternative embodiment used to monitor variation in the history effect of SOI transistors. As shown in FIG. 7, an SOI delay chain and pulse generator 405 is provided, which is arranged for each input test signal to generate both a rising edge pulse indicative of a propagation delay of a rising edge and a falling edge pulse indicative of a propagation delay of a falling edge. The rise pulse and fall pulse are provided to rising edge counter 410 and falling edge counter 415, respectively, which both receive the same timing reference signal from the oscillator circuitry 420. The count values produced are then provided to a buffer 425 where they are temporarily stored, whilst one or more further input test data patterns are passed to the delay chain 405 to produce further rising edge and falling edge counts.

In one particular embodiment, a test data selector 400 is provided which, when a test enable signal is asserted, initiates two test sequences through the delay chain 405. In particular, a DC0 test data pattern is input as a first test data, this test pattern representing a temporary transition from a steady logic 0 state. Following that test pattern, then a DC1 test data pattern is provided as a second test data, representing a temporary transition from a logic 1 state.

Once rising edge counts and falling edge counts have been stored within the buffer 425 for both test data patterns, then the comparators 430, 435 are used to compare the various rising edge counts and various falling edge counts, with the comparison results from the comparators being input to evaluation circuitry 440. The evaluation circuitry 440 can be arranged in a variety of ways, but in one embodiment retains the comparison results within a storage 445, so that they can be compared with other comparison results obtained at different times, thereby enabling an accurate assessment of how the history effect is varying within the monitored circuit 405 over time.

Figure 8:
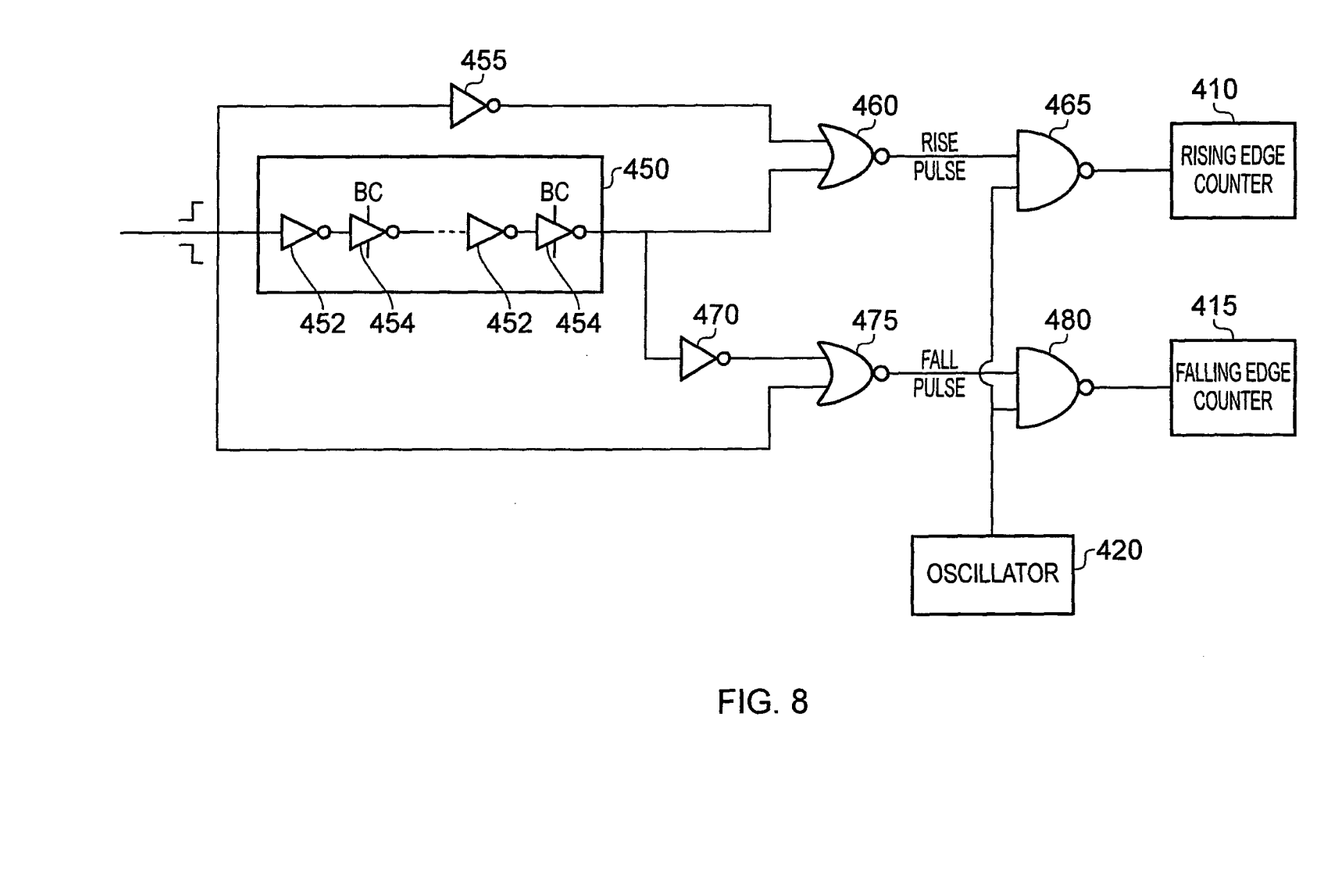
FIG. 8 illustrates in more detail the SOI delay chain and pulse generator of FIG. 7 in accordance with one embodiment.

FIG. 8 illustrates in more detail the SOI delay chain and pulse generator 405 of FIG. 7 in accordance with one embodiment. In particular, a delay chain 450 is provided consisting of an equal number of inverters, each inverter being formed from SOI transistors, and every alternate inverter having its transistors arranged in a body contacted arrangement. As a result, the body contacted inverters 454 are not affected by the history effect, and instead the history effect is observed only within the inverters 452.

The NOR gate 460 receives the output from the delay chain 450 and an inverted version of the input via inverter 455, whilst the NOR gate 475 receives an inverted version of the output from the delay chain 450 (via inverter 470) and the original input. As a result, it will be understood that the NOR gate 460 will produce a pulse whose width varies dependent on the propagation delay of a rising edge transition through the delay chain 450, whilst the NOR gate 475 produces a pulse whose width varies dependent on the propagation delay of a falling edge transition through the delay chain 450. The various pulses are then input to corresponding NAND gates 465, 480, which also receive the output from the oscillator 420. Accordingly, during the period of time when the pulse is asserted, the corresponding NAND gate will output a logic 1 value each time an oscillation of the timing reference signal occurs, with the corresponding counter 410, 415 then keeping a count of the number of logic 1 values received from the corresponding NAND gate.

Figure 9A:
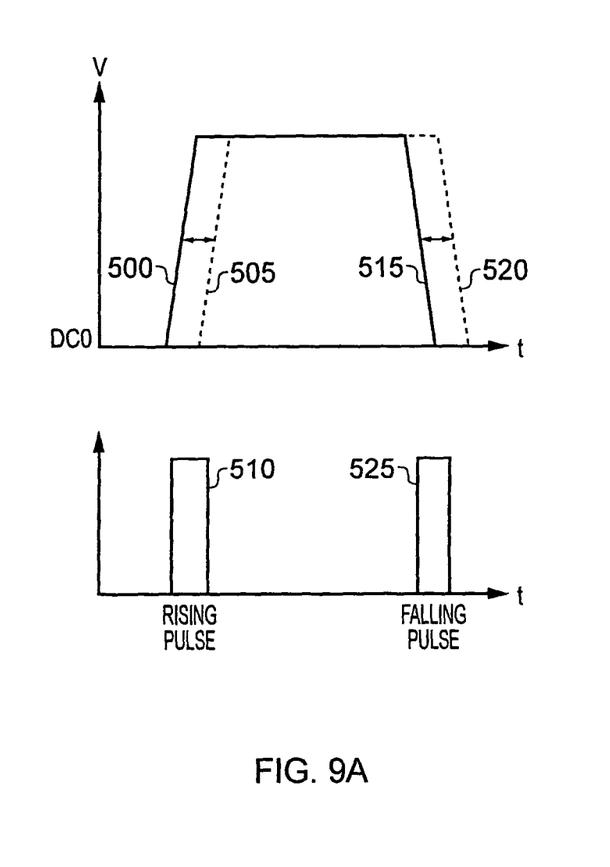
FIGS. 9A and 9B illustrate the various rising pulses and falling pulses generated when using the apparatus of FIG. 7 in accordance with one embodiment.
Figure 9B:
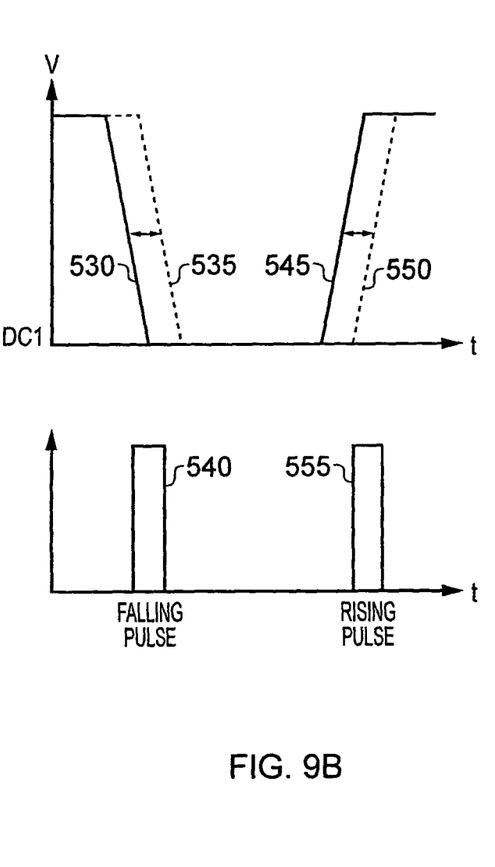

FIGS. 9A and 9B schematically illustrate how the various rising pulses and falling pulses are generated using the circuitry of FIGS. 7 and 8. In accordance with the DC0 test as shown in FIG. 9A, a temporary transition from the logic 0 state will occur, causing a rising edge to take place at time 500 and a falling edge to take place at time 515. The corresponding output from the delay chain 450 is represented by the dotted lines, and accordingly the rising edge will be delayed until time 505 and the falling edge will be delayed until time 520. A rising edge pulse 510 and a falling edge pulse 525 are accordingly produced, both pulses having a width indicative of the corresponding delay in the rising pulse or falling pulse.

FIG. 9B illustrates the corresponding DC1 test, representing a temporary transition from the logic 1 state. Again the falling edge 530 and rising edge 545 are delayed as shown by the lines 535, 550, and accordingly a falling pulse 540 and a rising pulse 555 are produced.

The above arrangement discussed with reference to FIGS. 7, 8, 9A and 9B provides a particularly simple and effective mechanism for producing digital information indicative of variations in the history effect.

Figure 10:
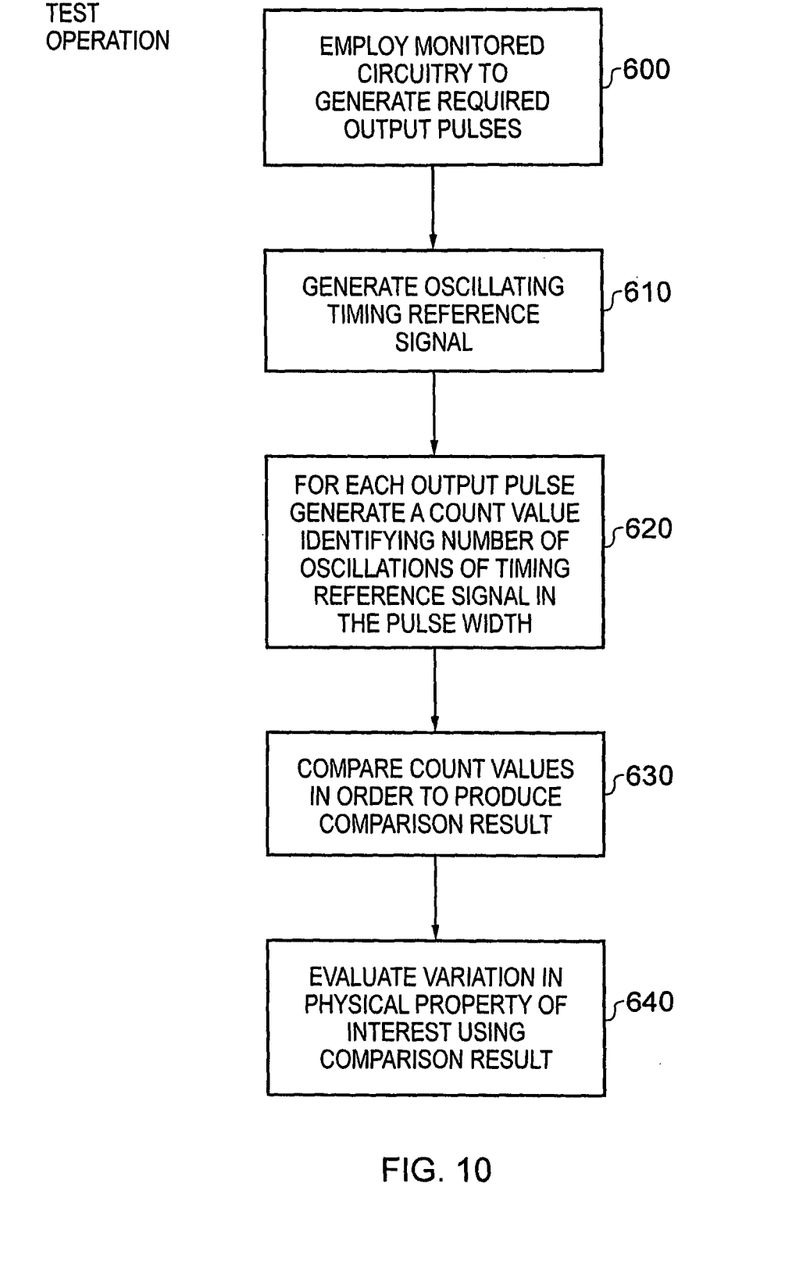
FIG. 10 is a flow diagram illustrating a method of determining variation in a predetermined physical property of a circuit in accordance with one embodiment.

FIG. 10 is a flow diagram illustrating a test operation performed in accordance with one embodiment. At step 600, the monitored circuitry is employed in order to generate the required output pulses. As will be appreciated from the earlier discussion of various embodiments, this may be achieved by arranging multiple monitored circuits to produce output pulses in parallel, or by employing a single monitored circuit to generate multiple output pulses at different times.

At step 610, an oscillating timing reference signal is generated, and then at step 620 a count value is generated for each output pulse, identifying the number of oscillations of the timing reference signal that have occurred within the pulse width of that output pulse. As a result, a digital count value is produced that is indicative of the pulse width, and hence indicative of a value of the predetermined physical property.

At step 630, the various count values produced are compared in order to produce a comparison result, whereafter at step 640 the variation in the physical property of interest is evaluated using the comparison result.

From the above description of embodiments, it will be appreciated that such embodiments provide a flexible and efficient mechanism for determining variation in a predetermined physical property of a circuit, that can be used "on the fly" as and when required during the lifetime of a circuit. In accordance with the described technique, the predetermined physical property of interest is not measured directly, but instead the monitored circuitry is arranged to produce output pulses such that the pulse width is indicative of a current value of the predetermined physical property. Counter circuitry then produces an associated count value for each output pulse, such count values forming digital information providing a quantitive indication of a current value of the predetermined physical property, such that two or more count values can then be compared in order to produce a comparison result that can be used to determine the variation in the predetermined physical property.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. Apparatus for determining variation in a predetermined physical property of a circuit, comprising:
    monitored circuitry for generating output pulses, the monitored circuitry being configured such that each output pulse has a pulse width which is indicative of a current value of said predetermined physical property;
    oscillator circuitry configured to generate an oscillating timing reference signal;
    counter circuitry configured to produce for each output pulse, with reference to the oscillating timing reference signal, an associated count value indicative of the pulse width of that output pulse; and
    comparison circuitry configured to compare the associated count values for at least two output pulses, in order to produce a comparison result used to determine the variation in said predetermined physical property.

2. Apparatus as claimed in claim 1, wherein:
said monitored circuitry comprises a plurality of monitored circuits; and
said at least two output pulses compared by the comparison circuitry comprise an output pulse generated by each monitored circuit, with the pulse width of each output pulse being indicative of a current value of said predetermined physical property within the monitored circuit, producing that output pulse.

3. Apparatus as claimed in claim 2, wherein the counter circuitry comprises a separate counter circuit for each monitored circuit.

4. Apparatus as claimed in claim 2, further comprising evaluation circuitry configured to generate a notification signal if the comparison result indicates that the variation of the current value of said predetermined physical property within said plurality of monitored circuits is greater than a predetermined threshold.

5. Apparatus as claimed in claim 2, wherein:
a test operation is initiated periodically, each occurrence of the test operation causing the plurality of monitored circuits to produce corresponding output pulses from which count values are then produced by the counter circuitry;
for each test operation, the comparison circuitry being arranged to compare the count values produced by the counter circuitry in order to produce said comparison result; and
the apparatus further comprising evaluation circuitry configured to monitor variation in the comparison result over a series of said test operations in order to determine the variation in said predetermined physical property.

6. Apparatus as claimed in claim 2, wherein:
said plurality of monitored circuits comprise a tested monitored circuit and a reference monitored circuit;
the reference monitored circuit is configured so as to exhibit a benchmark value for said predetermined physical property; and
the comparison circuitry is configured to compare the count value for an output pulse from the tested monitored circuit with the count value for a corresponding output pulse from the reference monitored circuit in order to produce said comparison result.

7. Apparatus as claimed in claim 6, wherein said predetermined physical property is an ageing effect on components within the tested monitored circuit that causes performance of those components to vary through use.

8. Apparatus as claimed in claim 7, wherein:
said reference monitored circuit is formed as a replica of said tested monitored circuit;
the reference monitored circuit is active only for test operations where an output pulse is generated by the reference monitored circuit for comparison with a corresponding output pulse from said tested monitored circuit, whilst said tested monitored circuit is active for other operations in addition to said test operations, such that components in said tested monitored circuit are subjected to said ageing effect more rapidly than the components in said reference monitored circuit.

9. Apparatus as claimed in claim 8, wherein said tested monitored circuit is used to perform actual data processing operations in a normal mode of operation of the apparatus.

10. Apparatus as claimed in claim 2, wherein:
said plurality of monitored circuits are distributed at different locations within an integrated circuit; and
said comparison circuitry is configured to compare the associated count values for corresponding output pulses produced by each monitored circuit in order to produce said comparison result, said comparison result being indicative of the variation in said predetermined physical property across said integrated circuit.

11. Apparatus as claimed in claim 10, wherein said predetermined physical property is one of a threshold voltage of components, an operating temperature of components and a history effect of components.

12. Apparatus as claimed in claim 10, wherein said plurality of monitored circuits are identical to each other.

13. Apparatus as claimed in claim 1, wherein said monitored circuitry comprises a single monitored circuit configured to produce the at least two output pulses at different times, such that the pulse width of each output pulse is indicative of the value of said predetermined physical property within that single monitored circuit at the time the output pulse is generated.

14. Apparatus as claimed in claim 13, wherein said single monitored circuit comprises components formed from transistors having a body region insulated from a substrate, and said predetermined physical property is a history effect that causes voltage on said body region to vary over time dependent on previous activity of the monitored circuit, thereby causing performance of the components to vary over time based on said previous activity.

15. Apparatus as claimed in claim 14, wherein:
said single monitored circuit comprises an inverter chain arranged to produce a rising edge output pulse and a falling edge output pulse, the rising edge output pulse having a pulse width indicative of rising edge propagation delays within the inverter chain and the falling edge output pulse having a pulse width indicative of falling edge propagation delays within the inverter chain;
the counter circuitry is configured to generate a rising edge count value for said rising edge output pulse, and a falling edge count value for said falling edge output pulse;
the comparison circuitry is arranged to compare the rising edge count values for rising edge output pulses produced at different times, and the falling edge count values for falling edge output pulses produced at different times in order to produce said comparison result.

16. Apparatus as claimed in claim 15, wherein said single monitored circuit is driven at a first time by an input signal providing a temporary transition from a DC logic 0 value in order to produce a first rising edge output pulse and a first falling edge output pulse, and is driven at a second time by an input signal providing a temporary transition from a DC logic 1 value in order to produce a second rising edge output pulse and a second falling edge output pulse, the comparison circuitry being arranged to compare the rising edge count values for the first and second rising edge output pulses, and to compare the falling edge count values for the first and second falling edge output pulses in order to produce said comparison result.

17. Apparatus as claimed in claim 1, wherein the monitored circuitry is configured such that a signal propagation delay within the monitored circuitry is dependent on the current value of said predetermined physical property, each output pulse being generated such that the pulse width is determined by said signal propagation delay.

18. A method of determining variation in a predetermined physical property of a circuit, comprising:
employing monitored circuitry to generate output pulses such that each output pulse has a pulse width which is indicative of a current value of said predetermined physical property;

generating an oscillating timing reference signal;

with reference to the oscillating timing reference signal, producing for each output pulse an associated count value indicative of the pulse width of that output pulse; and comparing the associated count values for at least two output pulses, in order to produce a comparison result used to determine the variation in said predetermined physical property.

19. Apparatus for determining variation in a predetermined physical property of a circuit, comprising:

monitored circuitry means for generating output pulses such that each output pulse has a pulse width which is indicative of a current value of said predetermined physical property;

oscillator means for generating an oscillating timing reference signal;

counter means for producing for each output pulse, with reference to the oscillating timing reference signal, an associated count value indicative of the pulse width of that output pulse; and comparison means for comparing the associated count values for at least two output pulses, in order to produce a comparison result used to determine the variation in said predetermined physical property.

* * * * *